US008116999B2

(12) United States Patent
Notohamiprodjo et al.

(10) Patent No.: US 8,116,999 B2
(45) Date of Patent: Feb. 14, 2012

(54) CONTROL OF DELIVERY OF CURRENT THROUGH ONE OR MORE DISCHARGE LAMPS

(75) Inventors: Hubertus Notohamiprodjo, Union City, CA (US); Radu Pitigoi-Aron, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 44 days.

(21) Appl. No.: 12/302,012

(22) PCT Filed: May 22, 2008

(86) PCT No.: PCT/US2008/064565
§ 371 (c)(1),
(2), (4) Date: Nov. 21, 2008

(87) PCT Pub. No.: WO2008/147903
PCT Pub. Date: Dec. 4, 2008

(65) Prior Publication Data
US 2010/0250165 A1  Sep. 30, 2010

Related U.S. Application Data

(60) Provisional application No. 60/939,469, filed on May 22, 2007.

(51) Int. Cl.
*G01R 19/25* (2006.01)
(52) U.S. Cl. .......................................... 702/64; 324/414
(58) Field of Classification Search ..................... 702/64
See application file for complete search history.

(56) References Cited

U.S. PATENT DOCUMENTS

| 3,836,797 | A |   | 9/1974  | Steen |
|-----------|---|---|---------|-------|
| 4,709,339 | A | * | 11/1987 | Fernandes ................... 700/293 |
| 5,434,479 | A |   | 7/1995  | Ohnishi et al. |
| 5,721,689 | A | * | 2/1998  | Hart et al. ....................... 702/75 |
| 6,046,551 | A |   | 4/2000  | Kita |
| 6,486,615 | B2 |  | 11/2002 | Hui et al. |
| 6,708,125 | B2 | * | 3/2004 | Bierl ................................ 702/64 |
| 6,876,157 | B2 |  | 4/2005  | Henry |
| 7,061,189 | B2 |  | 6/2006  | Newman, Jr. et al. |

(Continued)

FOREIGN PATENT DOCUMENTS

EP  1 718 129  2/2006
(Continued)

OTHER PUBLICATIONS

Cosby et al. "A Resonant Inverter for Electronic Ballast Applications", IEEE Transactions on Industrial Electronics 41(4):418-425, Aug. 1994.

(Continued)

*Primary Examiner* — Andrew Schechter
*Assistant Examiner* — Haidong Zhang

(57) ABSTRACT

Method to identify a current drawn by a fluorescent lamp in a circuit. Methods include receiving a voltage supplied to a fluorescent lamp drawing a current in response to the voltage, digitally sampling the voltage at a sampling frequency and associating a first time stamp with a voltage value representing one of a maximum or minimum value in observed voltage, receiving the current after receiving the voltage, digitally sampling the current at the sampling frequency and associating multiple second time stamps with a corresponding multiple current values, identifying a second time stamp, a difference between the first time stamp and the second time stamp being within a threshold, and identifying a current value associated with the second time stamp as the current drawn by the fluorescent lamp.

15 Claims, 9 Drawing Sheets

U.S. PATENT DOCUMENTS

| | | | |
|---|---|---|---|
| 7,589,480 B2 | 9/2009 | Greenwood et al. | |
| 2002/0017897 A1 | 2/2002 | Wilcox et al. | |
| 2002/0158613 A1 | 10/2002 | Muratov et al. | |
| 2002/0175636 A1 | 11/2002 | Kawasaka et al. | |
| 2003/0122605 A1 | 7/2003 | Ulrick et al. | |
| 2004/0085031 A1 | 5/2004 | Hsieh | |
| 2004/0174122 A1 | 9/2004 | Ribarich | |
| 2006/0020406 A1* | 1/2006 | Takakamo et al. | 702/64 |
| 2007/0103093 A1* | 5/2007 | Hagen et al. | 315/291 |
| 2007/0188111 A1* | 8/2007 | Taipale | 315/291 |
| 2008/0284352 A1 | 11/2008 | Notohamiprodjo et al. | |
| 2008/0284442 A1 | 11/2008 | Notohamiprodjo et al. | |
| 2009/0096391 A1 | 4/2009 | Notohamiprodjo et al. | |

FOREIGN PATENT DOCUMENTS

| | | |
|---|---|---|
| JP | 2001-244088 | 7/2001 |
| JP | 2003-059684 | 2/2003 |

OTHER PUBLICATIONS

Johnson et al., "Steady-State Analysis and Design of the Parallel Resonant Converter", IEEE Transactions on Power Electronics 3(1):93-104, Jan. 1988.

Kazimierczuk et al., "Electronic Ballast for Fluorescent Lamps", IEEE Transactions on Power Electronics 8(4):386-395, Oct. 1993.

Nelms. "Hamonic Analysis of a Parallel-Loaded Resonant Converter", IEEE Transactions on Aerospace and Electronic Systems 27(4):683-688, Jul. 1991.

International Preliminary Report on Patentability and Written Opinion, dated Dec. 3, 2009, issued in International Application No. PCT/US2008/064565.

* cited by examiner

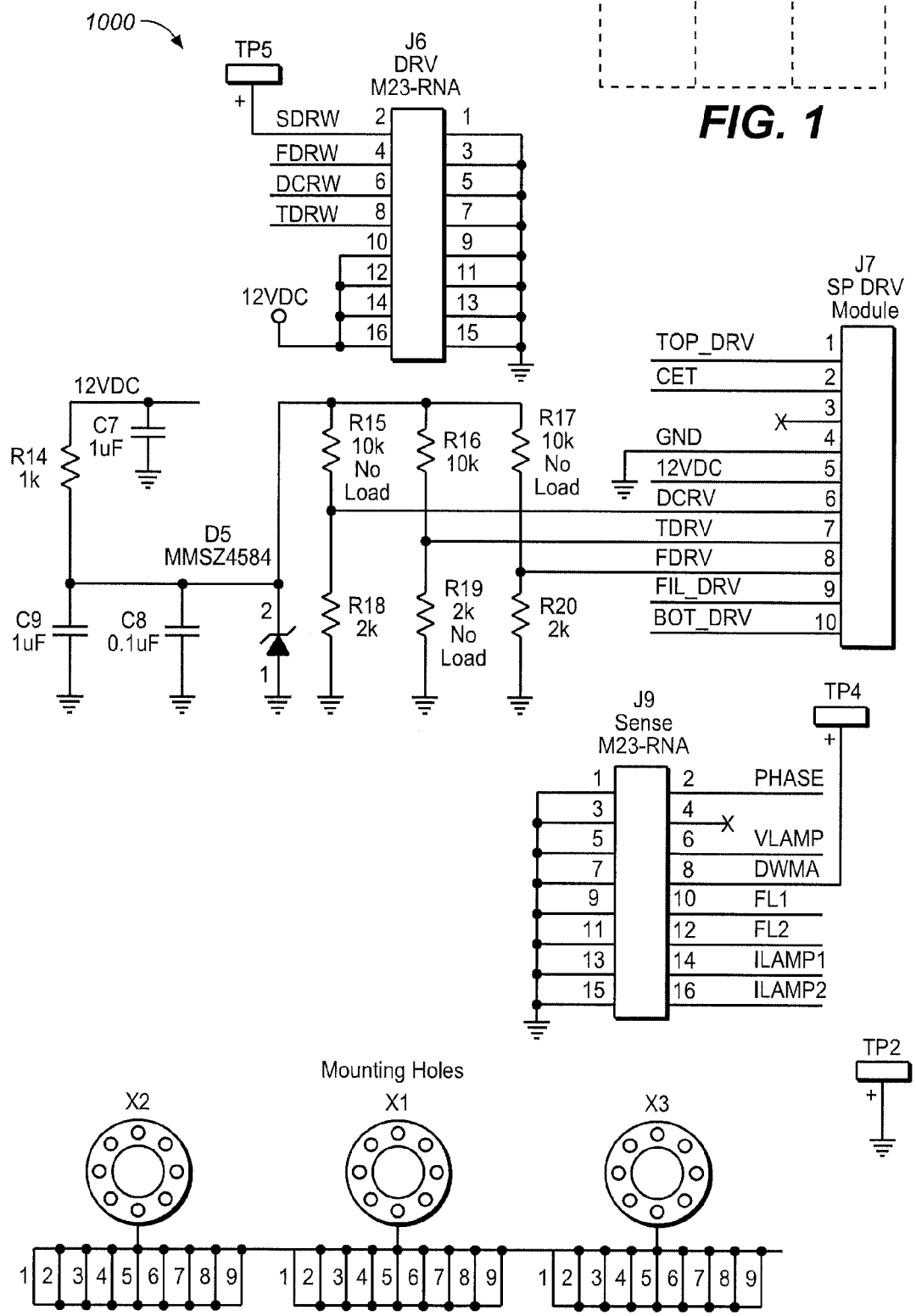

CONTROL OF DELIVERY OF CURRENT THROUGH ONE OR MORE DISCHARGE LAMPS

CROSS-REFERENCE TO RELATED APPLICATIONS

This application claims the benefit of the priority of U.S. Provisional Patent Application No. 60/939,469 filed May 22, 2007, and entitled "Ballast Controller." The specification of the above application is incorporated herein by reference in its entirety.

BACKGROUND

The subject matter of the present specification relates to controllers to operate discharge lamps, e.g., fluorescent lamps.

In general, a fluorescent lamp assembly is made from a tube filled with an inert gas, for example, argon, and some low pressure mercury vapors. The inside of the tube is coated with a fluorescent material. The fluorescent lamp includes two electrodes attached to either end of the tube. The electrode includes a filament surrounded by an emitting cathode. When the filament is warmed up, the cathode emits thermal electrons that form an electron cloud around the cathode. When a potential difference is applied between the filaments, the charge carriers accelerate towards the positive electrode. While migrating towards the positive electrode, the charge carriers collide with one or more mercury atoms. If the energy with which a charge carrier collides with a mercury atom is sufficiently high, then the mercury atom emits ultraviolet radiation. When the coating on the inside of the tube receives the ultraviolet radiation, the coating emits radiation in the visible spectrum, which appears as light.

Electronic ballasts are typically used to operate fluorescent lamps, such operations including switching the lamps on and off, dimming the lamps, and the like. An electronic ballast for fluorescent lamp dimming control can use several circuits, for example, a series LC resonant series loaded circuit, a series resonance parallel loaded circuit, a series parallel resonance circuit, and the like. The series circuits are typically controlled by either frequency or the duty cycle of symmetrically chopped input voltage pulses. A series resonance parallel loaded circuit, used in an electronic ballast, behaves like a low-pass filter and shows a high gain at high impedance that is required by the fluorescent lamp during ignition and low dimming. The input of the electronic ballast comes from a source, for example, a DC source. Two switching elements turn on and off in response to a signal from a controller to convert the DC voltage into an AC voltage. The controller controls states of the switching elements, and thus the waveform of the AC voltage, in accordance with a desired dimming level. By controlling the timing of turning the switching elements on and off, the current flowing through a fluorescent lamp can be changed, and the light output of the fluorescent lamp can be varied. An electronic ballast operated using a series resonance parallel loaded circuit that includes double switch choppers at the DC output is generally adjustable, providing the high voltage required for lamp ignition, short circuit proof, and offers increased voltage in high impedance and low load during dimming.

SUMMARY

This specification describes technologies relating to control of delivery of current through one or more discharge lamps (e.g., fluorescent lamps).

In one aspect, a fluorescent lamp control process is described. The process includes detecting input to decrease a brightness of a fluorescent lamp operated by a driving signal. In response to detecting the input, the process includes modifying the driving signal to decrease the brightness of the fluorescent lamp. Modifying the driving signal includes operating the driving signal using two alternately applied duty cycles that are substantially complementary to each other, the first duty cycle greater than the second duty cycle, and the second duty cycle less than the first duty cycle. Operating the driving signal includes applying the first duty cycle and the second duty cycle to a first control signal and a second control signal, respectively, to generate the driving signal, and alternating the duty cycle applications to the control signals. Modifying the driving signal includes increasing a frequency at which the duty cycles are applied.

This, and other aspects, can include one or more of the following features. The process can further include simultaneously increasing the first duty cycle and decreasing the second duty cycle while substantially maintaining a complementarity of the first duty cycle and the second duty cycle. Operating the driving signal can include using fixed values for the duty cycles when the input indicates the brightness is being decreased below a threshold. Operating the driving signal can include using increasing and decreasing values for the first and second duty cycles, respectively, when the input indicates the brightness is being decreased from a value above the threshold. Using increasing and decreasing values can occur when the input indicates the brightness is being decreased from the value above the threshold, which value is also below another threshold. The frequency can be inversely proportional to the value between the threshold and the another threshold. A summation of the complementary duty cycles can represent substantially 100% of an operating duty cycle of the driving signal. The driving signal can be modified by pulse width modulation. Other aspects include implementations of the processes described herein in one or more processors.

In another aspect, a system includes two fluorescent lamps, two switching elements operatively coupled to a first fluorescent lamp and a second fluorescent lamp, a source to operate the two fluorescent lamps by providing a driving signal via the two switching elements, and a processor configured to perform the operations described herein.

In another aspect, a method to identify a defective filament in a fluorescent lamp in a circuit is described. The method includes supplying a voltage to a circuit including one or more fluorescent lamps and an anti-parallel transformer. Each fluorescent lamp includes two filaments. A primary side of the transformer is operatively coupled to a first filament and a secondary side of the transformer is operatively coupled to a second filament. The first filament and the second filament draw a first current flowing through the primary side of the transformer and a second current flowing through the secondary side of the transformer, respectively. The method includes monitoring a resistance of the transformer. The resistance is below a threshold as long as the first filament and the second filament are present in the circuit which causes the first current and the second current, respectively, to flow through the primary side and the secondary side of the transformer, respectively. Upon determining that the resistance increases above the threshold, the method includes identifying that either the first filament or the second filament is absent from the circuit.

This, and other aspects can include one or more of the following features. The first filament and the second filament can be included in a same fluorescent lamp. The first filament can be determined to be absent from the circuit when current flowing through the primary side is below a threshold. The voltage can include an operating voltage supplied at an operating frequency. The method can further include, upon identifying that either the first filament or the second filament is absent from the circuit, supplying a detection voltage at a frequency greater than the operating frequency to the circuit. The detection voltage can be alternately turned on for a first duration and turned off for a second duration. A resistance of the transformer can be when the detection voltage is supplied to the circuit. The method can further include, upon detecting that the measured resistance is less than the threshold, turning off the detection voltage and supplying the operating voltage at the operating frequency. The first duration can be 10 ms and the second duration can be 300 ms. Other aspects include a processor configured to perform the operations described herein.

In another aspect, a system to identify a defective filament in a fluorescent lamp in a circuit is described. The system includes a circuit including a first fluorescent lamp, a second fluorescent lamp, a transformer including a primary side operatively coupled to a first filament of the first fluorescent lamp and a secondary side of the transformer operatively coupled to a second filament of the second fluorescent lamp, a voltage source to supply a voltage, and a processor operatively coupled to the first driver and the second driver, configured to perform operations described herein.

In another aspect, a method to identify a fluorescent lamp among multiple fluorescent lamps is described. The method includes receiving input to a circuit comprising multiple fluorescent lamps operated by corresponding multiple control signals. Each fluorescent lamp is configured to output radio frequency (RF) signals in response to receiving a discovery signal. The input is to identify which first control signal is provided to a first fluorescent lamp. In response to receiving the input, the method includes providing a first discovery signal in place of each control signal provided to each fluorescent lamp, one fluorescent lamp at a time. The method also includes determining that the first fluorescent lamp outputs RF signals, and identifying the control signal that was replaced with the discovery signal that caused the first fluorescent lamp to output the RF signals.

This, and other aspects, can include one or more of the following features. Providing the first discovery signal in place of a control signal can include overriding the control signal. Providing the first control signal in place of each discovery signal need not affect a luminosity of a fluorescent lamp to which the first control signal is provided. The first discovery signal can be common to the multiple fluorescent lamps. Identifying the control signal that was replaced with the discovery signal that caused the first fluorescent lamp to output the RF signals can include storing the control signal that was replaced with the discovery signal in a memory, and upon determining that the first fluorescent lamp outputs RF signals, identifying the stored control signal from the memory. Other aspects include a processor configured to perform the operations described herein.

In another aspect, a system to identify a fluorescent lamp among multiple fluorescent lamps is described. The system includes multiple fluorescent lamps, a processor operatively coupled to the multiple fluorescent lamps, the processor to provide corresponding multiple control signals to the multiple fluorescent lamps, the processor configured to perform operations comprising receiving input to detect which control signal is provided to which fluorescent lamp, and in response to receiving the input, replacing the multiple control signals with corresponding providing multiple discovery signals, each discovery signal causing the fluorescent lamp to which the discovery signal is provided to output unique RF signals, a memory storing an association between the unique RF signals, the multiple discovery signals, and the multiple control signals that are replaced, and a central management facility configured to receive the unique RF signals from each lamp, and identify the control signal that was replaced with the discovery signal that caused each fluorescent lamp to output the RF signals.

This, and other aspects, can include one or more of the following features. The system can further include an RF receiver to determine that the first fluorescent lamp outputs RF signals.

In another aspect, a method to identify parameters to operate a fluorescent lamp is described. The method includes supplying a voltage through a resistor in a circuit, where the resistor is selected based on a fluorescent lamp, determining that a value of a current drawn by the resistor is included in a range of current values stored in a storage location comprising a parameter set including one or more parameters to operate the fluorescent lamp, the parameter set corresponding to the range of current values and the fluorescent lamp, retrieving the parameter set to operate the fluorescent lamp, and providing the retrieved parameter set to operate the lamp.

This, and other aspects, can include one or more of the following features. The storage location can be a look-up table. The fluorescent lamp can be operatively coupled to the circuit. The storage location can further include multiple parameter sets corresponding to multiple ranges of current values to operate multiple fluorescent lamps. The parameter set can include one or more of a power rating of the fluorescent lamp, an operating frequency of the fluorescent lamp, and an operating voltage of the fluorescent lamp. The method can further include, for a new fluorescent lamp, creating a new parameter set including one or more parameters to operate the new fluorescent lamp, identifying a new resistor for the new fluorescent lamp, identifying a new value of current that is generated when the voltage is supplied to the new resistor, and including the new value of current, the new parameter set, and a name of the new fluorescent lamp in the storage location. Other aspects of the processes described herein can be implemented in one or more processors configured to perform the above-recited operations.

In another aspect, a system to identify parameters to operate a fluorescent lamp is described. The system includes a resistor selected based on a fluorescent lamp operated at one or more parameters included in a parameter set corresponding to the fluorescent lamp, a source to provide a voltage to the resistor, and an apparatus operatively coupled to the resistor and the source in a circuit. The apparatus includes an input receiver to receive a current generated responsive to supplying the voltage through the resistor in the circuit, and a processor configured to perform the operations described herein.

In another aspect, a method to identify a current drawn by a fluorescent lamp in a circuit is described. The method includes receiving a voltage supplied to a fluorescent lamp drawing a current in response to the voltage, digitally sampling the voltage at a sampling frequency and associating a first time stamp with a voltage value representing an inflection in observed voltage, receiving the current after receiving the voltage, digitally sampling the current at the sampling frequency and associating multiple second time stamps with a corresponding multiple current values, identifying a second time stamp, a difference between the first time stamp and the second time stamp being within a threshold, and identifying a current value associated with the second time stamp as the current drawn by the fluorescent lamp.

This, and other aspects, can include one or more of the following features. The inflection in observed voltage can be a maximum voltage value. The method can further include receiving the voltage for multiple operating cycles of the voltage, digitally sampling the voltage at the sampling frequency to associate multiple voltage time stamps with corresponding multiple voltage values, each maximum voltage value representing a maximum voltage belonging to each operating cycle of the voltage, comparing the multiple maximum voltage values to identify the maximum observed voltage value. The method can further include receiving the current for multiple operating cycles of the current, digitally sampling the current at the sampling frequency to associate multiple current time stamps with corresponding multiple current values in each operating cycle of the current, identifying an observed current time stamp, a difference between the observed current time stamp and the maximum voltage time stamp being less than the threshold, and identifying a current value associated with the observed current time stamp as the current drawn by the fluorescent lamp. The method can further include digitally sampling the voltage at the sampling frequency to associate a third time stamp to a minimum voltage value representing a minimum observed voltage corresponding to a negative portion of the voltage cycle, identifying a new second time stamp, a difference between the third time stamp and the new second time stamp being within the threshold, and identifying a current value associated with the second time stamp as the current drawn by the fluorescent lamp during the negative portion of the voltage cycle. Other aspects can be implemented in one or more processors configured to perform the operations described herein. Other aspects can be implemented in systems including the one or more processors configured to perform the operations described herein.

The described systems and techniques can result in one or more the following advantages. The brightness of fluorescent lamps in a lighting system can be decreased using switching elements that control the fluorescent lamps. Alternate switching of the complementary duty cycles of the switching elements that control the fluorescent lamps can ensure that one filament does not fail earlier than the other filament. Coupling two filaments (from a same fluorescent tube, or from two separate fluorescent tubes—e.g., two adjacent filaments in an application in which two fluorescent tubes are operated in parallel) respectively to two sides of an anti-parallel transformer and monitoring an impedance offered by the transformer can enable detecting whether one of the filaments is absent or defective. This method can be extended to all fluorescent lamps in the lighting system. The same processor can be used in different lighting systems. The fluorescent lamps in one lighting system need not share the same specification with those in another lighting system. The processor can be configured to detect the type of fluorescent lamps in a lighting system and to provide the appropriate parameter set including parameters to operate the fluorescent lamps. In this sense, the processor is portable within lighting systems. The processor can control multiple fluorescent lamps within the same lighting system, and can be configured to enable a technician to determine which control signal, the supply of which is controlled by the processor, is supplied to which fluorescent lamp in the lighting system. The processor can also be configured to perform digital operations on analog voltage and current signals to identify current drawn by a fluorescent lamp, and distinguish the lamp current from current generated due to parasitic capacitance. This is particularly useful when the lamp is dimmed because the magnitude of contribution of the parasitic capacitance at low lamp brightness levels can be comparable to the magnitude of the lamp current itself. In such scenarios, distinguishing between lamp current and parasitic capacitance contributions enables better control of lamp dimming. The systems and techniques described herein can also enable fine control of the output power of fluorescent lamps when the lamps are dimmed. Such fine control can result in maximizing the life of the fluorescent lamp. Fault detection and protection, and in-circuit replacement of the fluorescent lamps are also possible. The processor can perform these digital operations for the phase determination using a single analog to digital converter (ADC).

The details of one or more implementations are set forth in the accompanying drawings and the description below. Other features, aspects, and advantages may become apparent from the description, the drawings, and the claims.

BRIEF DESCRIPTION OF THE DRAWINGS

FIG. 1, which includes FIGS. 1A, 1B, and 1C, is an example circuitry of a lighting system.

DETAILED DESCRIPTION

The systems and techniques described herein can be implemented in one or more devices, for example, one or more integrated circuit (IC) devices, finite state machine (FSM) processors, and the like, that are operatively coupled to circuits to operate lighting systems, for example, industrial lighting systems in buildings. A processor can receive control signals, for example, voltage signals, from one or more power sources, and transmit the control signals to one or more components of an industrial lighting system.

Figure 1B:
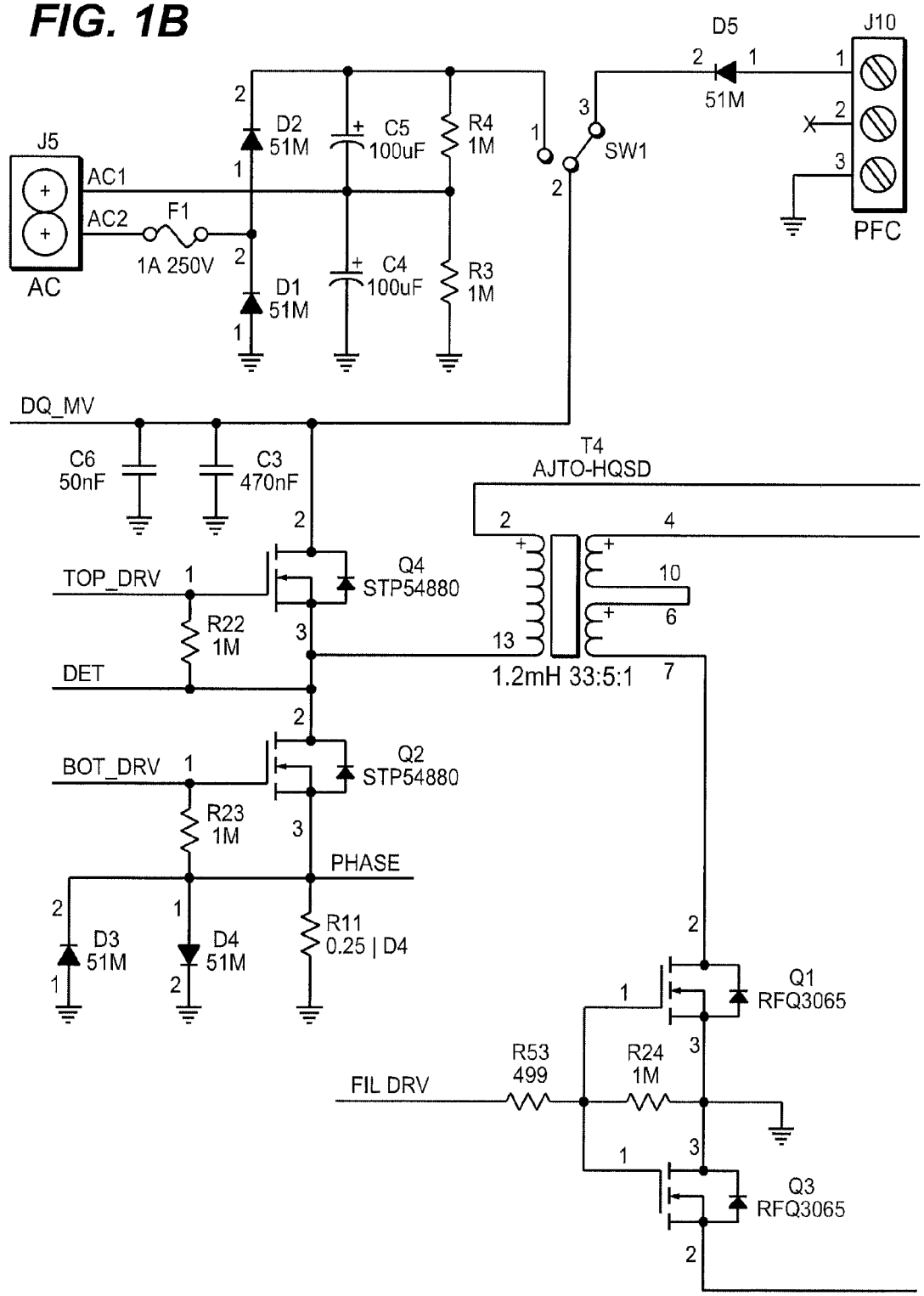
Figure 1C:
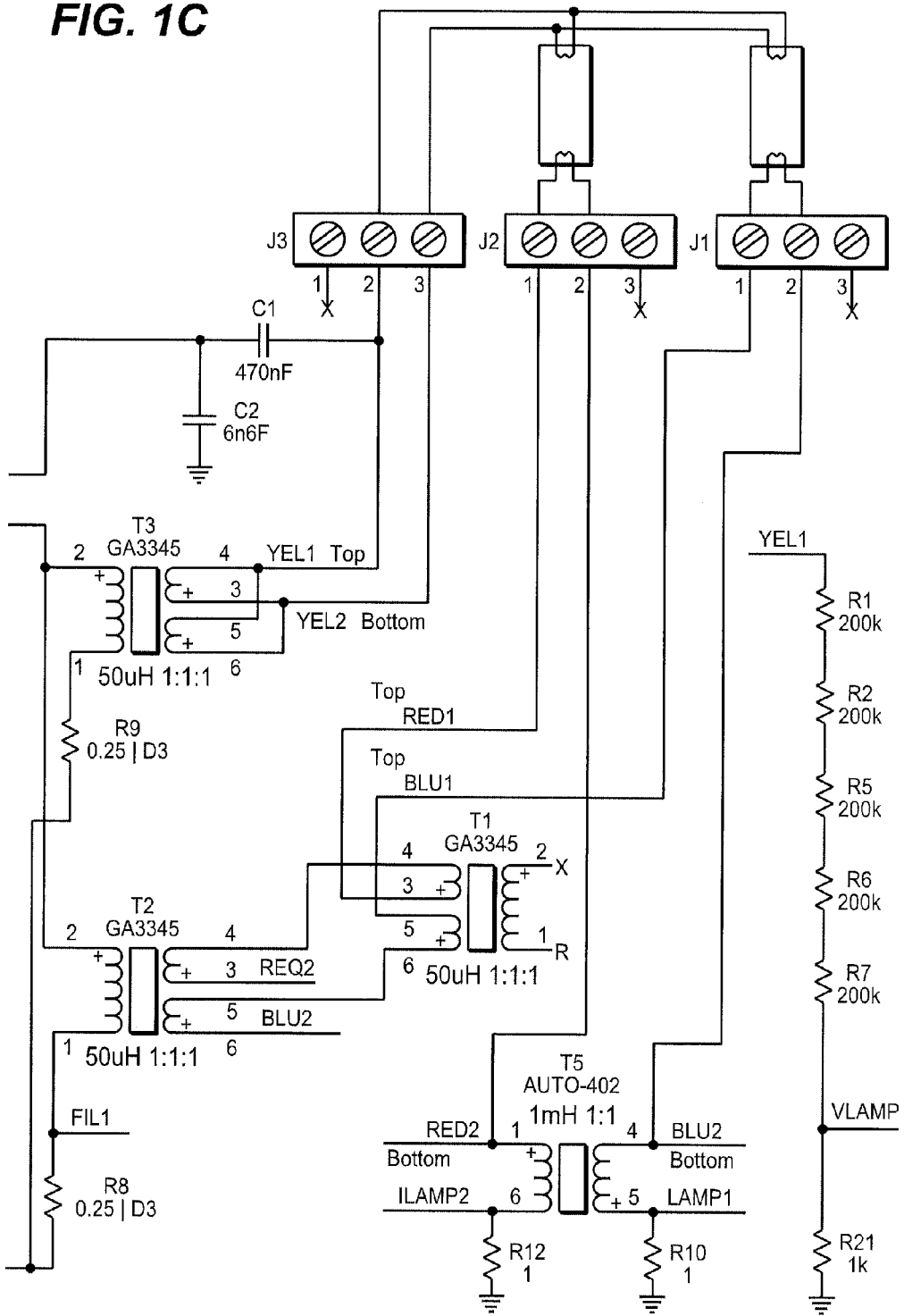

FIG. 1, which includes FIGS. 1A, 1B, and 1C, depicts a schematic of example circuitry of a lighting system 1000 including electrical components, for example, switching elements, transformers, inductor-capacitor (LC) and resistor-capacitor (RC) components, and the like, operatively coupled in one or more circuits to operate discharge lamps, for example, fluorescent lamps. Lighting systems, such as lighting system 1000, are typically installed in buildings and are frequently operated using ballast controllers operatively coupled to the lighting systems.

A ballast controller includes a processor configured to provide voltage pulses to the lighting system 1000 to enable a technician to control the lamps in the lighting system 1000. In some implementations, the lighting system 1000 includes a series resonant parallel loaded ballast with double switching elements. To dim a fluorescent lamp in the lighting system 1000, the processor operates the two switching elements simultaneously causing a change in the current drawn by the fluorescent lamps. In addition to controlling the operation of the fluorescent lamps, the processor in the ballast controller is configured to perform multiple operations that will be described in reference to the figures that follow.

Figure 2:
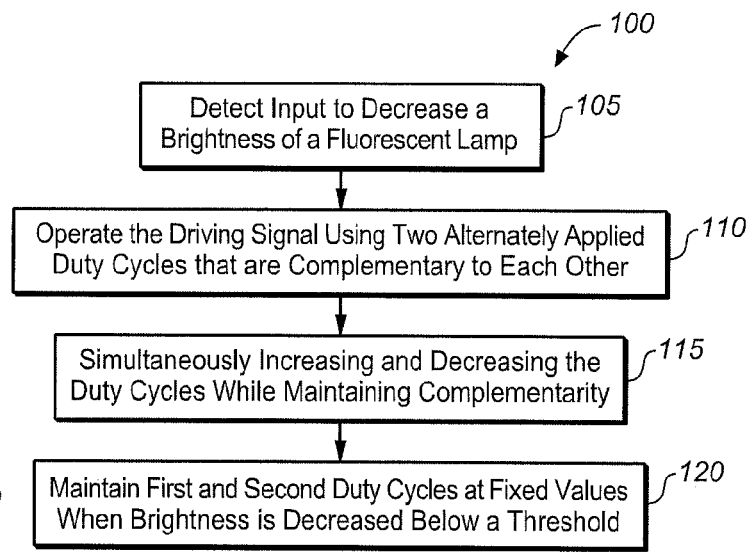
FIG. 2 is a flowchart of an example process to control a fluorescent lamp.

FIG. 2 is a flowchart of an example process 100 to control a fluorescent lamp. The process detects input to decrease a brightness of a fluorescent lamp (105). The fluorescent lamp is included in a lighting system, for example, the lighting system 1000 shown in FIG. 1, and is operated by a driving signal. In some implementations, the fluorescent lamp can be operatively coupled to a series resonance parallel loaded circuit that receives voltage from a source controlled by a processor. The processor is a component of a ballast controller to operate the lighting system. The circuit can include two switching elements that receive control signals, for example, voltage pulses, from a processor to operate the fluorescent lamp.

In response to detecting the input, the process 100 operates the driving signal using two alternately applied duty cycles that are substantially complementary to each other (110). For example, the driving signal can be supplied to the fluorescent lamp via two switching elements, each of which is controlled by a corresponding control signal. The processor can change the current to the fluorescent lamp by controlling the switching elements. In some implementations, the first and second control signals controlled by the two switching elements can be applied at the first and second duty cycles, respectively, resulting in the two duty cycles being applied to the driving signal. In addition, the processor can alternate the application of the first duty cycle and the second duty cycle to the first control signal and the second control signal, respectively. Further, the processor can increase a frequency at which the duty cycles are applied. These operations on the switching elements cause a decrease in a brightness of the lamp.

The process simultaneously increases the first duty cycle and decreases the second duty cycle while substantially maintaining a complementarity of the first duty cycle and the second duty cycle (115). In some implementations, the decrease in brightness can be measured by a feedback circuit included in the lighting system. For example, the brightness of the lamp can be measured by converting brightness into an electrical signal, for example, a digital signal, that is associated with a value. The measured value can be compared with a stored value associated with a brightness threshold. If a difference between a measured and stored value is within a predetermined limit, then it is determined that the brightness of the lamp has reached a threshold.

To further reduce the brightness of the lamp, the first and duty cycles can be simultaneously increased and decreased. For example, the first duty cycle and the second duty cycle can be 50% each. The two duty cycles are considered substantially complementary as long as a summation of the duty cycles is 100% or at least 90%. When the lamp brightness decreases to a threshold, for example, 20% of the operating brightness, the first duty cycle can be increased to more than 50%, for example, 70% and the second duty cycle can be decreased to 30%. This maintains the complementarity of the two duty cycles because the summation is 100%. Although the example process 100 describes the summation of the two duty cycles to be 100%, in some implementations a delay is intentionally introduced in the operation of the switching elements to ensure that the two switching elements never conduct simultaneously. Therefore, a summation of the first and second duty cycles is substantially 100% because of the delay.

Below a brightness level corresponding to a first threshold, for example, 20% of the output power, the first and second duty cycles can be held at fixed values. For example, when the brightness level corresponds to approximately 80% of the output power, the first and second duty cycles applied to the driving signal are 50%. As the brightness decreases from 80% to the first threshold, for example, 20%, the first duty cycle can be increased in steps while simultaneously decreasing the second duty cycle. In some scenarios, the first duty cycle can be increased to 51%, 52%, 53%, and so on, while the second duty cycle can simultaneously be decreased to 49%, 48%, 47%, and so on. This can be repeated until the brightness level corresponds to the first threshold. In addition, the duty cycles can be alternately applied.

At the first threshold, the first and second duty cycle can be, for example, 70% and 30%, respectively. Continuing to simultaneously increase and decrease the first and second duty cycle can cause lamp flickering or extinguishing. It can also lead to failure of the lamp electrodes. To avoid these, the process maintains first and second duty cycles at these fixed values when the brightness is decreased below the first threshold (120). Details related to operating a fluorescent lamp using complementary duty cycles can be found in U.S. patent application Ser. No. 10/883,342 entitled "Mixed Mode Control for Dimmable Fluorescent Lamp," which was filed on Jul. 1, 2004, the entire contents of which are incorporated herein by reference. The driving signal can be modified using pulse width modulation.

Figure 3:
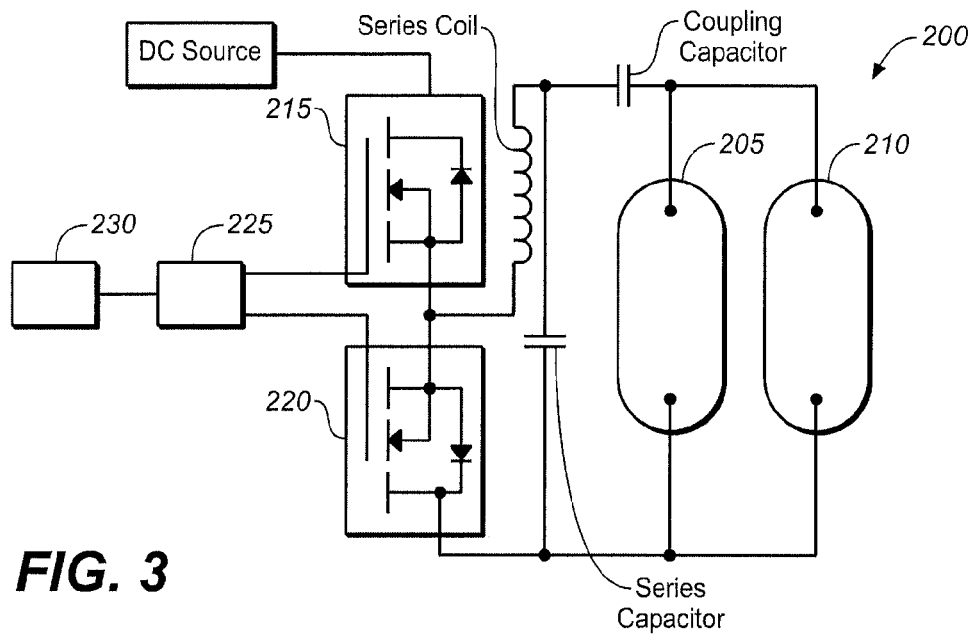
FIG. 3 is a schematic of an example circuit to control two fluorescent lamps.

FIG. 3 is a schematic of an example circuit 200 to control two fluorescent lamps 205 and 210. The two fluorescent lamps 205 and 210 are operatively coupled to two switching elements 215 and 220. The switching elements can be field effect transistors. The circuit 200 includes a source 225 that provides control signals to the first switching element 215 and the second switching element 220, thereby providing driving signals to operate the two fluorescent lamps 205 and 210. Further, the circuit 200 is controlled by a processor 230 that controls the voltage source 225 and performs the operations described with reference to FIG. 2. The values to be applied to the first and second duty cycles while simultaneously increasing and decreasing the duty cycles can be stored in a memory that is operatively coupled to the processor 230. In some implementations, the memory can be included in the processor 230.

Figure 4:
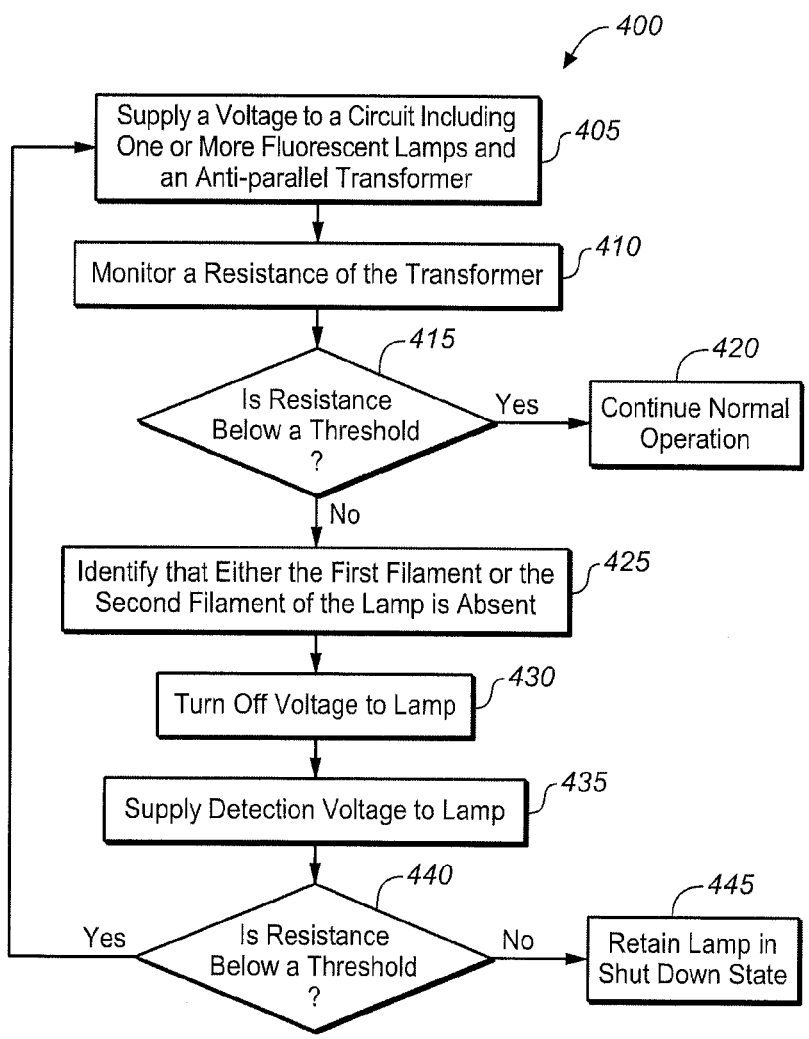
FIG. 4 is a flowchart of an example process to identify a defective filament in a circuit including fluorescent lamps.

FIG. 4 is a flowchart of an example process 400 to identify a defective filament in a circuit including fluorescent lamps. The process supplies a voltage to a circuit including one or more fluorescent lamps and an anti-parallel transformer (405). For example, the industrial lighting system 1000 can include multiple transformers including the anti-parallel transformer. A first filament and a second filament of a fluorescent lamp in the industrial lighting system 1000 can be operatively coupled to a primary side and a secondary side of the anti-parallel transformer, respectively. Alternatively, a first filament of a first fluorescent lamp and a second filament of a second fluorescent lamp can be operatively coupled to a primary side and a secondary side of the anti-parallel transformer, respectively. Each filament can serve as a load to the corresponding side of the transformer, and can draw a current.

Two filaments of one or more fluorescent lamps are typically not identical to each other, but are similar. When the same control signal is supplied to the two filaments, the temperatures of the two filaments increase. While the filament temperatures may not equal each other, the temperatures will typically differ by a small temperature threshold, for example, of the order of less than 2° C. Because the current drawn by a filament is a function of filament temperature, the current drawn by one filament need not be equal to that drawn by the other. Nevertheless, the difference between the currents drawn by the two filaments can be within a current threshold. As long as the current is within the current threshold, an impedance offered by the transformer is small, for example on the order of fractions of ohms. If the difference in the current drawn by the two filaments increases above the current threshold, then the resistance offered by the transformer increases, for example, as high as hundreds of ohms. The current drawn by one filament will decrease in the absence of a filament or in the presence of a defective filament.

The process monitors a resistance of the transformer (410). For example, the resistance of the transformer can be measured and associated with a value. The processor that operates the one or more fluorescent lamps and the transformer can receive the measured value.

The process checks if the resistance is below a threshold (415). For example, a threshold resistance value can be stored in the processor. The processor can compare the measured resistance value with the threshold value and determine whether the measured resistance is greater than or less than the threshold resistance. If the measured resistance value is below the threshold, the process continues normal operation (420).

If the measured resistance value is greater than the threshold, the process identifies that either the first filament or the second filament is absent from the circuit (425). The filament may be absent from the circuit because a fluorescent lamp, of which the filament is a component, is defective or because a fluorescent lamp has been removed from the circuit. In such scenarios, a current drawn by one filament can be greater than the current drawn by the other filament, causing the impedance of the transformer to increase.

Upon identifying that a filament is absent from the circuit, the process turns off the voltage to the lamp (430). For example, when the processor determines that a filament is absent from the circuit, based on the comparison of the measured resistance and the threshold resistance, the processor can cause the voltage source to stop supplying control signals to the circuit that includes the one or more fluorescent lamps and the transformer.

In some implementations, in addition to stopping the supply of control signals to the circuit, the processor can provide an output indicating that the fluorescent lamp is defective. For example, the processor can cause a light on a display screen to be turned on or an alarm to sound. In response, a technician can examine the fluorescent lamp in the circuit to identify any defect and replace the fluorescent lamp if needed.

When the resistance offered by the transformer is below the threshold, then the processor can supply the control signal, for example, the voltage signal at an operating frequency. After the voltage signal is turned off, the processor can periodically check the circuit to determine if the defect in the circuit has been fixed. To do so, the processor supplies a detection voltage signal to the one or more fluorescent lamps in the circuit (435). The detection voltage signal can have a frequency that can be greater than the operating frequency. If the defect in the circuit has been fixed, for example, if the defective filament has been identified and replaced, then the resistance offered by the transformer decreases. If not, then the resistance remains greater than the threshold resistance.

The process checks whether the resistance offered by the transformer in response to receiving the detection voltage is less than the threshold (440). If the resistance is not below the threshold, then the process retains the lamp in a shutdown state (445). For example, the processor can periodically receive a measured resistance offered by the transformer in response to receiving the detection voltage. The processor can compare the measured resistance with a threshold resistance. In some implementations, the threshold resistance can be the same as the threshold resistance when the voltage signal is supplied at the operating frequency. In some implementations, a new threshold resistance, that corresponds to the detection voltage at the frequency greater than the operating frequency, can be determined and stored in the processor. If the processor determines that the measured resistance is not below the threshold resistance corresponding to the detection voltage, then the processor need not cause the voltage source to supply voltage signals to the circuit.

Once the defect in the circuit is fixed, for example, the defective filament is replaced, and the detection voltage is supplied to the circuit, the resistance offered by the transformer will be below the threshold resistance. Upon detecting the measured resistance is below the threshold resistance, the processor can turn off the detection voltage and can supply voltage at the operating frequency to the circuit. Further, during periodic testing of the circuit, the processor can turn on the detection voltage for a first duration, for example, 10 ms, and turn off the detection voltage for a second duration, for example, 300 ms.

Figure 5:
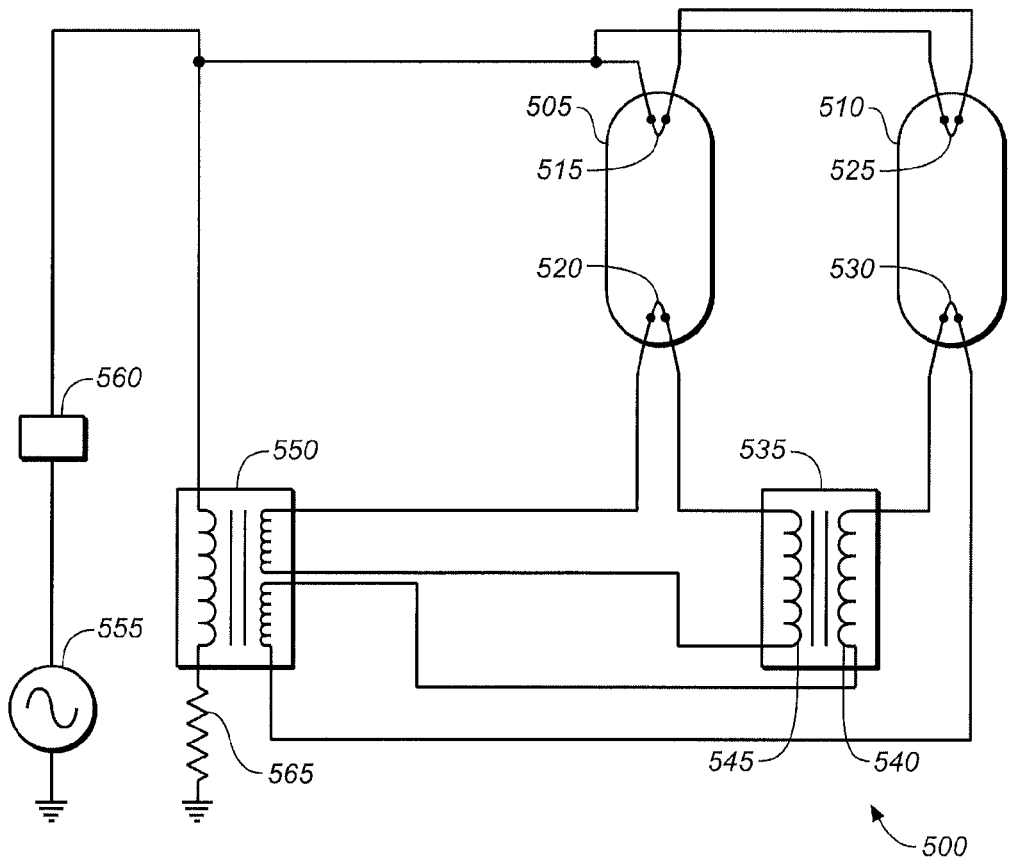
FIG. 5 is a schematic of an example circuit to identify a defective filament in a fluorescent lamp.

FIG. 5 is a schematic of an example circuit 500 to identify a defective fluorescent lamp. The circuit 500 includes two fluorescent lamps 505 and 510. Fluorescent lamp 505 includes two filaments 515 and 520, and fluorescent lamp 510 includes two filaments 525 and 530. The circuit 500 includes an anti-parallel transformer 535. The circuit 500 also includes a transformer 550 including one winding on a primary side and two windings on a secondary side. One of the two secondary side windings can be operatively coupled to the filament 520 of the fluorescent lamp 505 and a primary side 545 of the anti-parallel transformer. The second of the two secondary side windings of the transformer 550 can be operatively coupled to the filament 530 of the fluorescent lamp 510 and the secondary side 540 of the transformer 545. The primary side of the transformer 550 can be operatively coupled to a voltage source 555 to supply voltage signals to the fluorescent lamps and the transformers. The operation of the voltage source 555 can be controlled using a processor 560.

The processor 560 is configured to detect the absence of either the fluorescent lamp 505 or the fluorescent lamp 510 by performing operations described with reference to FIG. 5. In normal operation, the filament 520 and the filament 530 draw respective currents. In such scenarios, the anti-parallel transformer 535 offers very low resistance, such resistance being determined based on the current drawn by the resistor 565 operatively coupled to the circuit 500. If either of the lamps 505 or 510 is absent, for example, because either of the lamps is defective, then the defective lamp no longer draws a current. This causes the impedance offered by the anti-parallel transformer 535 to increase. When the resistance increases above a threshold resistance that is stored, for example, in a memory operatively coupled to the processor 560, the voltage supply from the voltage source 555 is terminated.

Although the processor 560 in FIG. 5 is shown to detect defective fluorescent lamps, the processor 560 can be configured to detect one defective filament of two filaments in the same fluorescent lamp. For example, one filament of the fluorescent lamp can be operatively coupled to the primary side of an anti-parallel transformer, and the other filament can be operatively coupled to the secondary side of the anti-parallel transformer. Based on a resistance offered by the transformer to the flow of current to both filaments, the absence of a filament in the fluorescent lamp can be detected. An industrial lighting system can include multiple fluorescent lamps, all of which have the same specification, and are operable under the same parameters. Different industrial lighting systems can employ fluorescent lamps of different configurations. A processor can be designed based on the type of fluorescent lamp to be used in a lighting system. Alternatively, the same processor can be configured to operate multiple fluorescent lamps. To do so, the parameters for operating each fluorescent lamp can be stored in the processor memory. To use the processor in an industrial lighting system, the type of fluorescent lamp that is used in the lighting system needs to be identified, and the parameter set corresponding to the fluorescent lamp in the system needs to be retrieved from the processor memory.

Figure 6:
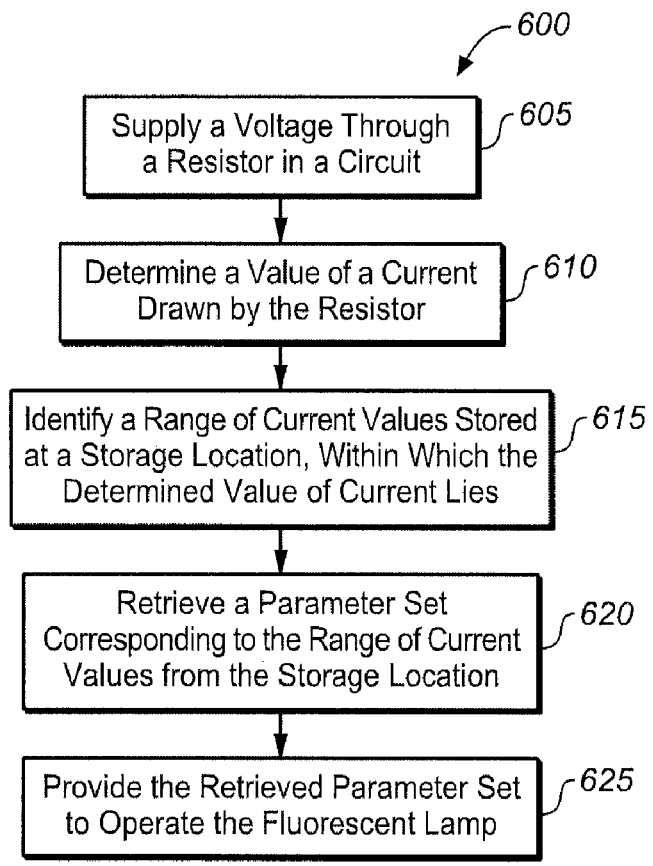
FIG. 6 is a flowchart of an example process to identify a fluorescent lamp.

FIG. 6 is a flowchart of an example process 600 to identify a fluorescent lamp. The fluorescent lamp is one of many lamps in an industrial lighting system. All the lamps in the lighting system have the same specification and are operable using the same set of parameters. The parameter set for the fluorescent lamp can be stored in a processor memory as one set of multiple parameter sets corresponding to multiple fluorescent lamps. To retrieve the parameter set corresponding to the fluorescent lamp, a signal, for example, a voltage signal, can be transmitted to the processor via a resistor that is operatively coupled to the processor in a circuit.

The process 600 supplies a voltage to the resistor in a circuit (605). The voltage signal can be supplied as an analog signal or as a digital pulse. For example, a voltage source can be operatively coupled to the resistor and the processor. The voltage source can supply a pulse to the resistor, in response to which the resistor draws a current.

The process 600 determines a value of the current drawn by the resistor (610). For example, the current drawn by the resistor can be associated with a value and can be received by the processor. The resistor that is operatively coupled with the processor can be chosen based on the type of fluorescent lamp in the lighting system. For example, a processor manufacturer can decide to associate a current value with each parameter set of a fluorescent lamp that is stored in the processor memory. In some implementations, the manufacturer can associate a range of current values with each parameter set of a fluorescent lamp. The processor manufacturer can prepare a chart that lists a resistor and a corresponding fluorescent lamp. Based on the chart, a technician installing the industrial lighting system can select a resistor. To cause the processor to provide the parameter set corresponding to the fluorescent lamps in the lighting system, the technician can couple the resistor with the processor and can provide a voltage signal to the resistor. The processor can receive a value of the current drawn by the selected resistor. In some implementations, the processor can internally generate the test current and supply the current to the resistor.

The process identifies a range of current values stored at a storage location, within which the determined current value lies (615). For example, the processor memory can be a storage location where ranges of current values are stored along with corresponding fluorescent lamps. In some implementations, the ranges of current values and the corresponding fluorescent lamps can be stored as look-up tables. The look-up tables can also store parameter sets that include parameters to operate each fluorescent lamp. The parameter sets can include one or more of a power rating of the fluorescent lamp, an operating frequency of the fluorescent lamp, an operating voltage of the fluorescent lamp, and the like. The identified range of current values can include the current value that was drawn by the resistor and received by the processor.

Based on the received current value, the process retrieves a parameter set corresponding to the range of current values from the storage location (620). For example, the processor can retrieve the parameter set that includes the parameters to operate the fluorescent lamp in the lighting system.

The process provides the retrieved parameter set to operate the fluorescent lamp (625). In some implementations, the processor can retrieve all parameters of the parameter set and provides all the parameters to an external device, for example, another processor. In alternative implementations, the processor can retrieve the parameter set from the look-up tables. As and when the processor receives one or more signals from the lighting system, the processor can provide the appropriate parameters to operate the fluorescent lamp.

Figure 7:
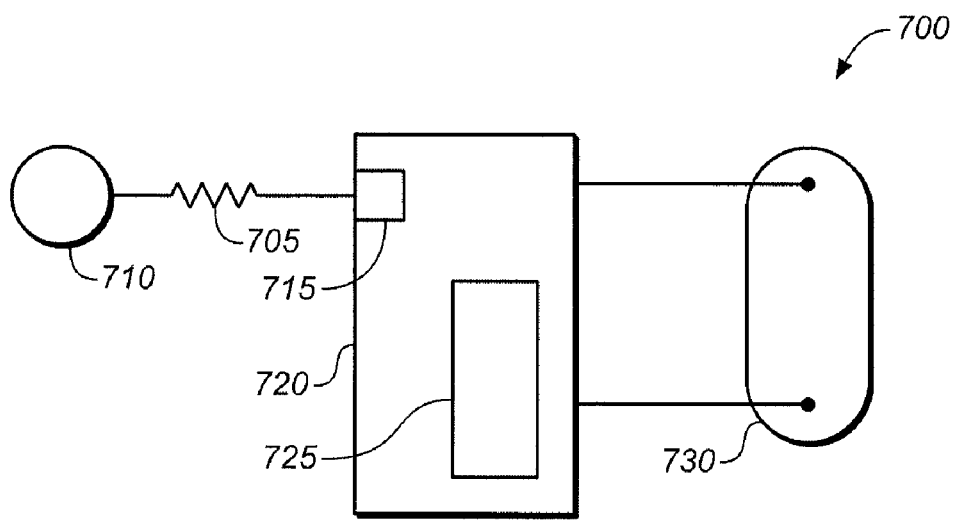
FIG. 7 is a schematic of an example circuit including a processor to identify parameters to operate a fluorescent lamp.

FIG. 7 is a schematic of an example circuit 700 including a processor to identify parameters to operate a fluorescent lamp. The circuit 700 includes a resistor 705 that receives a voltage signal from a source 710 to provide control signals, for example, voltage signals. In some implementations, the resistor 705 can be a 100 k$\Omega$ resistor or alternatively, can be a resistor of another rating. In the circuit 700, the source 710 and the resistor 705 are operatively coupled to a processor 720 that includes an input receiver 715. In some implementations, the input receiver 715 can be a soldering joint to which an end of the resistor 705 can be soldered. In other implementations, the input receiver 715 can be configured such that the resistor 705 is inserted into the input receiver 715. When a voltage from the source 710 is supplied to the resistor 705, the current drawn by the resistor 705 is received by the input receiver 715. In some implementations, the input receiver 715 can be included in the processor 720. Alternatively, the input receiver 715 can be a separate component that is operatively coupled to the processor.

Upon receiving the current drawn by the resistor 705, the processor 720 is configured to retrieve a parameter set from a storage location 725, for example, a look-up table, to operate a fluorescent lamp 730 according to the operations described with reference to FIG. 6. Although the example circuit 700 shows the storage location 725 within the processor 720, the storage location 725 can be located on an external device that is operatively coupled to the processor 720 to access information in the storage location 725. The fluorescent lamp 730 is included either in the circuit 700 or in a separate circuit. In some implementations, the look-up table may not include the parameter set for a new fluorescent lamp. The technician operating the lighting system can collect new parameters to operate the new fluorescent lamp and store the new parameter set in the storage location 725. In addition, the processor can identify a new resistor and a new current value, and associate the new current value with the new fluorescent lamp. Also, the processor can include a new range of current values in the storage location 725, within which the new current value lies. In response to receiving a current value that lies within the new range of current values, the processor identifies that the lamp that is to be operated is the new fluorescent lamp, and provides the corresponding new parameter set.

The parameter set to operate a fluorescent lamp can include a voltage to be supplied to the lamp, and can additionally include a current drawn by the lamp. In some implementations, the voltage signal can be an analog voltage signal. In response, the lamp can draw an alternating current which takes the shape of a sinusoidal wave. Due to parasitic capacitance, the sinusoidal waveform of the current may get shifted with respect to the phase of the analog voltage signal. In some implementations, the analog voltage and current signals can be converted into digital signals, and the lamp current can be identified from the digital signals.

Figure 8:
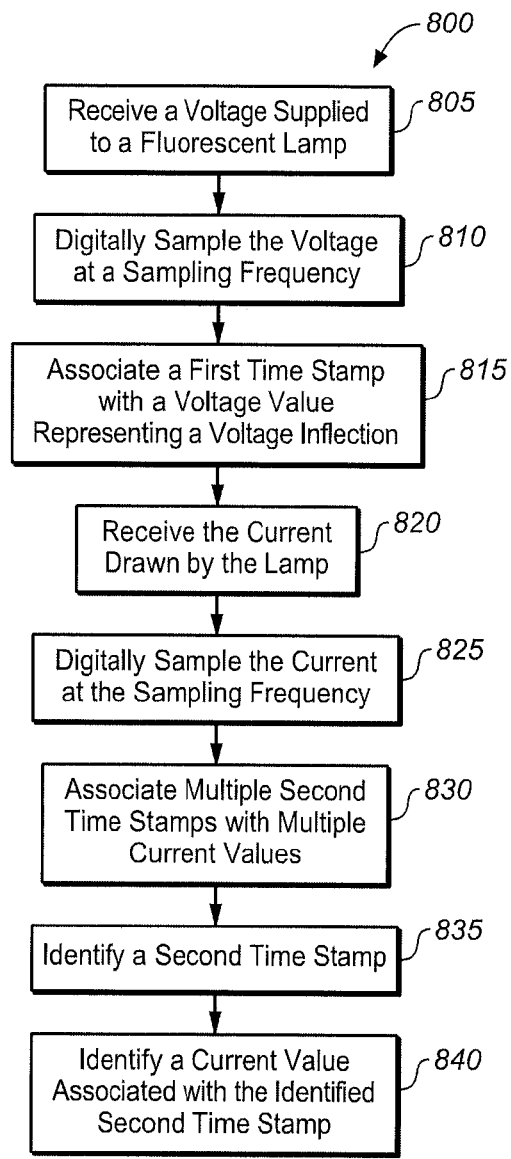
FIG. 8 is a flowchart of an example process to identify a current drawn by a fluorescent lamp in a circuit.

FIG. 8 is a flowchart of an example process 800 to identify a current drawn by a fluorescent lamp in a circuit. The process receives a voltage supplied to a fluorescent lamp (805). For example, the processor, to which the fluorescent lamp is operatively coupled, can be configured to cause a voltage source to supply a voltage signal, for example, an analog voltage signal to the circuit including the lamp. The circuit can include a feedback loop operatively coupling the processor and the voltage source. The analog voltage signal supplied to the circuit including the lamp can also be supplied to the processor via the feedback loop.

The process digitally samples the voltage at a sampling frequency (810). For example, the circuit can include an analog-to-digital converter (ADC) to convert the analog voltage signal into a digital voltage signal. The ADC can sample the analog voltage signal at a sampling frequency. In sampling the analog voltage signal, the ADC can associate multiple time stamps to a duration for which the analog voltage signal is received. The duration of the voltage signal depends on the frequency and the operating cycle of the signal. For example, if the operating cycle of the analog voltage signal is X ms, then the X ms are divided into multiple time stamps starting from 0 ms and ending at X ms in 0.01 ms intervals. The interval between consecutive time stamps depends on the sampling frequency of the ADC. The ADC can measure a value of the voltage signal at each time stamp, and associate the value with the corresponding time stamp.

The process associates a first time stamp with a voltage value representing an inflection (815). In some implementations, the inflection voltage can be the maximum voltage while, in other implementations, the inflection voltage can be the minimum voltage. For example, the processor can store the multiple voltage values that are associated with the multiple time stamps. The processor can identify the maximum voltage value and the corresponding time stamp.

The process receives the current after receiving the voltage (820). For example, the feedback loop that transmits the analog voltage signal to the processor can also be configured to transmit the current drawn by the lamp to the processor.

The process digitally samples the current at the sampling frequency (825). The ADC can receive the current drawn by the lamp, and digitally sample the current at the ADC's sampling frequency in a manner similar to the digital sampling of the voltage signal.

The process associates multiple second time stamps with multiple current values (830). For example, the processor can associate multiple time stamps and store multiple current values associated with the multiple time stamps.

The process identifies a second time stamp (835). The second time stamp associated with one of the current values corresponds to a first time stamp associated with the maximum voltage value. For example, the processor can compare the first time stamp and the second time stamp, and can determine that a difference between a first time stamp and the second time stamp lies within a threshold. In some implementations, because the time stamps for the current and voltage are generated at the sampling frequency, the multiple voltage time stamps are identical to the multiple current time stamps. In such scenarios, the processor identifies a second time stamp that is equal to the first time stamp. In some implementations, although digital sampling is performed with the same ADC, the multiple time stamps of current and voltage signals may not be identical to each other. In such implementations, the processor checks if a difference between corresponding time stamps is within a threshold. For example, the processor can determine a difference between each time stamp on the voltage time scale and each corresponding time stamp on the current time scale, and can check if the difference is less than the threshold.

Subsequently, the process 800 identifies a current value associated with the identified second time stamp (840). The current value associated with the identified time stamp represents a fluorescent lamp current distinguished from current due to parasitic capacitance. The current that is measured in the industrial lighting system 1000 is a combination of fluorescent lamp current and parasitic capacitances from other components in the system 1000. At 100% brightness levels, the contribution of the parasitic capacitance is not significant in comparison to that of the fluorescent lamp current. When the brightness of the lamp is decreased, for example, to or below 3% of the output power, the contribution of the parasitic capacitance increases. The process 800 enables distinguishing between a lamp current and a current due to parasitic capacitance.

Figure 9:
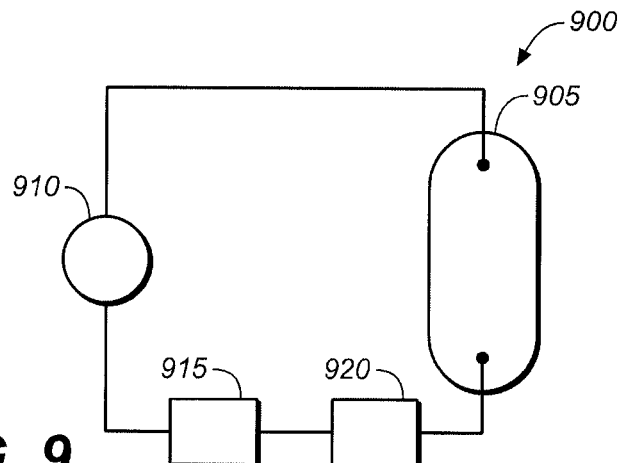
FIG. 9 is a schematic of an example circuit to identify a current drawn by a fluorescent lamp in a circuit.

FIG. 9 is a schematic of an example circuit 900 to identify a current drawn by a fluorescent lamp in a circuit. The circuit 900 includes a fluorescent lamp 905 to which an analog voltage signal is supplied using a voltage source 910. In response, the fluorescent lamp 905 draws an alternating current. The circuit 900 includes an ADC 915 that receives the analog voltage and the current. In some implementations, the ADC 915 receives the voltage for multiple cycles. For each cycle, the ADC 915 samples the voltage and associates time stamps with voltage values. The ADC 915 supplies the multiple time stamps and voltage values to the processor 920. The processor 920 identifies the maximum voltage value or the minimum voltage value for each cycle. The processor 920 also identifies the theoretical points of inflection of the voltage.

For example, the sampling time of the ADC 915 in the circuit 900 need not be synchronized with the lamp voltage and/or lamp current waveforms. To identify the true lamp current value, the component of the current that is in-phase with the voltage needs to be identified. To do so, time stamps can be given to each measured sample of the voltage and the lamp. The time stamps' counter can be reset at each start of the cycle for each of the parameters, namely for voltage, lamp current 1, and lamp current 2, in scenarios where two fluorescent lamps are included in the circuit. Because the ADC sampling frequency is not synchronized with the lamp voltage and/or lamp current waveforms, the measurements can have different time stamps for each sample of the measured parameter. The processor 920 can identify the time stamp that corresponds to the maximum value of the voltage. Subsequently, the processor can perform a sort action to identify the time stamp of the currents that is closest in value to the time stamp of the maximum value for the voltage. The current value that is associated with this identified time stamp is taken as the value in-phase with the lamp voltage. A similar process can be applied to identify minimum values. In some implementations, this process can be used for multiple cycles, for example, five cycles, to allow better identification of the maximum and minimum values.

In one example, the period of the measured signals (voltage and currents) is 10,200 ns, and the sampling period of the ADC is 500 ns. If the ADC 915 collects samples every 500 ns, then the voltage waveform has 20 samples (10,200/500) with the time stamps of the first cycle being 500 ns, 1000 ns, 1500 ns, and so on. The second voltage cycle will have time stamps of 300 ns, 800 ns, 1300 ns, and so on, the fourth voltage cycle will have time stamps of 100 ns, 600 ns, 1100 ns, and so on, the fourth voltage cycle will have time stamps at 400 ns, 900 ns, 1400 ns, and so on, and the fifth cycle will have time stamps at 0 ns, 500 ns, 1000 ns, 1500 ns, and so on.

The first sampling is started at the time that the voltage measuring cycle is started and the voltage, lamp current 1, and lamp current 2 are measured in that sequence. If the voltage is a perfect sinus, then the maximum voltage value would be at 2550 ns and the minimum value would be at 7650 ns. For the maximum, sample cycles one and three, having time stamps at 2500 ns and 2600 ns will be equally distanced from the real maximum, namely, 2550 ns. For the minimum, the third cycle will have the time stamp closest to the real value, namely, the 7600 ns time stamp. The waveforms are not ideal. In some implementations, the ADC can have a 10-bit resolution, and the sample voltages at 2500 ns and 2600 ns will not be the same. A difference between the sample voltage at these two time stamps can be compared to the theoretical maximum, and a voltage value that is nearest to the theoretical maximum can be identified. Based on this identification, either the 2500 ns or the 2600 ns time stamp can be chosen. In this example, it is assumed that the 2500 ns voltage sample is the maximum.

Lamp current 1 will have the following time stamps:
Cycle 1—300 ns, 800 ns, 1300 ns, and so on.
Cycle 2—100 ns, 600 ns, 1100 ns, and so on.
Cycle 3—400 ns, 900 ns, 1400 ns, and so on.
Cycle 4—0 ns, 500 ns, 1000 ns, 1500 ns, and so on.
Cycle 5—300 ns, 800 ns, 1300 ns, and so on.

Lamp current 2 will have the following time stamps:
Cycle 1—100 ns, 600 ns, 1100 ns, and so on.
Cycle 2—400 ns, 900 ns, 1400 ns, and so on.
Cycle 3—0 ns, 500 ns, 1000 ns, 1500 ns, and so on.
Cycle 4—300 ns, 800 ns, 1300 ns, and so on.
Cycle 5—100 ns, 600 ns, 1100 ns, and so on.

After loading these values in the memory, the processor 920 chooses, for the maximum lamp current 1, the sample associated with the 2500 ns time stamp, namely, from cycle 1. Similarly, for the minimum current, the processor 920 selects the sample associated with the 7600 ns time stamp, namely, from cycle 2. A similar procedure can be used for lamp 2 to determine a maximum value as the current associated with the 2500 ns time stamp in cycle three, and the minimum value as the current associated with the 7600 ns time stamp in cycle 1. These values are considered the real values for the lamp current, even though the measured waveforms may be different.

The ADC 915 digitally samples the received voltage and current signals. Thus, the processor 920 in the circuit 900 is configured to digitally identify a current drawn by a fluorescent lamp and to distinguish the fluorescent lamp current from a current generated by parasitic capacitance. In addition, the processor 920 is configured to perform the operations described with reference to FIG. 9.

If the lighting system is used to control lighting in a building, each fluorescent lamp can be located in different parts of the building. In such scenarios, identifying which control signal from the processor is supplied to which lamp can be difficult, especially in the absence of a blueprint of the circuit. As an option, a technician can serially turn off the control signals from the processor one signal at a time, and identify that a given control signal is supplied to a given lamp when the lamp turns off. Another method to identify which control signal is supplied to which fluorescent lamp is related to RF signals offered by a fluorescent lamp in response to receiving a control signal.

Figure 10:
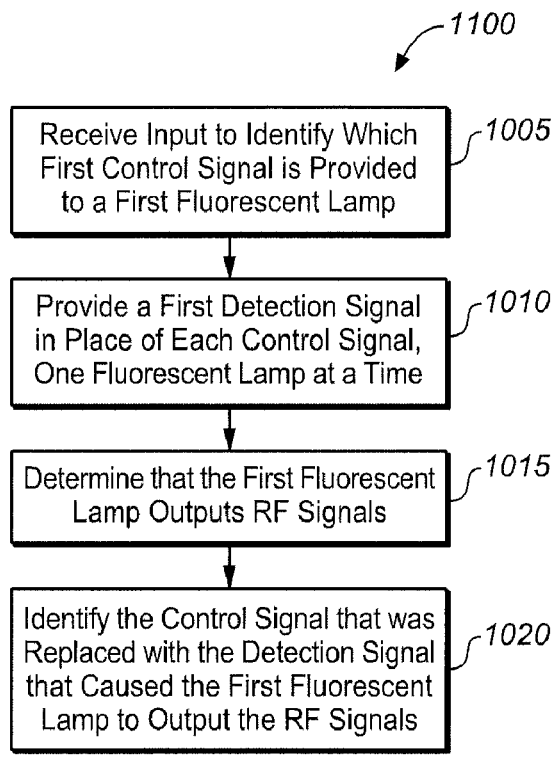
FIG. 10 is a flowchart of an example process to identify a fluorescent lamp among multiple fluorescent lamps.

FIG. 10 is a flowchart of an example process 1100 to identify a fluorescent lamp among multiple fluorescent lamps. The process receives input to identify which first control signal is provided to a first fluorescent lamp (1005). For example, in an industrial lighting system, a circuit can include multiple fluorescent lamps operatively coupled to a voltage source that is controlled by a processor that causes the voltage source to supply control signals to the multiple fluorescent lamps. The industrial lighting system can be employed in a building with several rooms, with each room including multiple fluorescent lamps. The processor can be controlled by a central management facility that controls the processor, thereby controlling the multiple fluorescent lamps in the building. The techniques described with reference to FIG. 10 enable a technician to map control signals supplied by the voltage source to fluorescent lamps that receive the control signals.

In response to the input, the process provides a first discovery signal in place of each control signal, one fluorescent lamp at a time (1010). For example, upon receiving input from the central management facility, the processor overrides control signals supplied to the fluorescent lamps with discovery signals, one fluorescent lamp at a time. The discovery signal can be chosen such that the discovery signal does not cause a change in lamp luminosity that is perceptible by the human eye. Further, the discovery signal causes a fluorescent lamp to which it is supplied to output electromagnetic radiation, for example, radio frequency (RF) signals. In some implementation, this RF radiation is detectable only in lamp's close vicinity. In this manner, the processor transmits a discovery signal to a first fluorescent lamp causing the first fluorescent lamp to output RF signals.

The process determines that the first fluorescent lamp outputs RF signals (1015). For example, a technician can use an RF receiver to determine whether the first fluorescent lamp outputs RF signals. The technician can hold the RF receiver against the first fluorescent lamp until the lamp emits the RF signals. The RF receiver can be configured to transmit an indication that RF signals are emitted to the central management facility that controls the supply of control signals. Alternatively or in addition, the RF receiver can be coupled to a display device that displays such an indication.

The process identifies the control signal that was replaced with the discovery signal that caused the first fluorescent lamp to output the RF signals (1020). For example, the RF receiver transmits the indication that the first fluorescent lamp has outputted RF signals to the central management facility. The central management facility is aware of which control signal was overridden by a discovery signal. Based on this information, the central management facility maps the control signal to the first fluorescent lamp, and stores the mapping in memory. Subsequently, the technician moves to the next fluorescent lamp, and the process 1100 is repeated.

In some implementations, the discovery signal sent to the multiple fluorescent lamps can have the same characteristics. This, in turn, can cause each fluorescent lamp to output similar RF signals. In some implementations, each fluorescent lamp can be configured to output unique RF signals in response to receiving the common discovery signals. In such implementations, the discovery signals can override all the control signals simultaneously. As long as the RF signal emitted by one fluorescent lamp does not interfere with the RF signal emitted by another fluorescent lamp, the RF signals of each lamp can be used to identify each fluorescent lamp. For example, the fluorescent lamp manufacturer can include the type of RF signals output by the lamp as part of lamp specifications. The central management facility can store a mapping of a fluorescent lamp and the RF signal output by the lamp in a memory. The memory already includes a mapping of the fluorescent lamps and control signals. When the discovery signals are supplied to the fluorescent lamps, the RF signals output by each lamp can be measured and compared against the mapping stored in the memory and used to identify control signals that are supplied to the fluorescent lamps.

Figure 11:
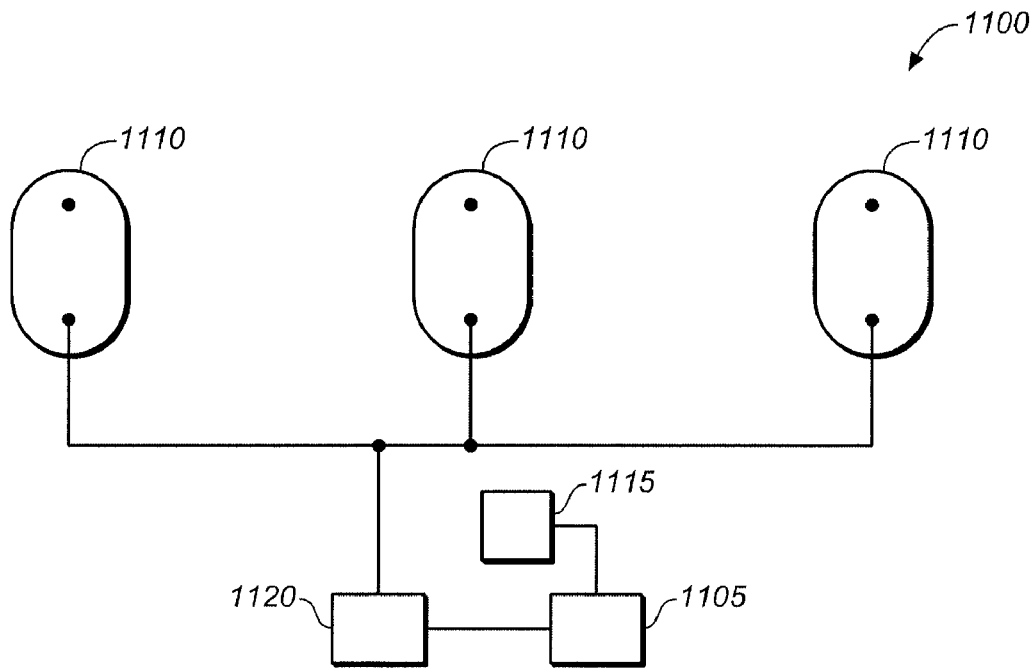
FIG. 11 is a schematic of an example circuit including multiple fluorescent lamps receiving control signals.

FIG. 11 is a schematic of an example circuit 1100 including multiple fluorescent lamps 1110 receiving control signals from a processor 1120 controlled by a central management facility 1105. The processor 1120 controls the supply of control signals to each fixture. The processor 1120 receives input from the central management facility 1105 to identify which control signal is supplied to which fluorescent lamp in the circuit 1100. In response, the processor 1120 is configured to enable the technician to identify control signals supplied to the fixtures 1205 by performing operations described with reference to FIG. 10.

In some implementations, the central management facility 1105 is configured to provide each fluorescent lamp 1110 in the circuit 1100 with a unique RF signal that causes the fluorescent lamp 1110 that receives the discovery signal to output RF signals. The central management facility 1105 is operatively coupled to a memory 1115 that stores a mapping of the unique discovery signal and the corresponding unique RF signals. Based on the detected RF signals, the central management facility 1110 identifies the fluorescent lamp that is supplied with a unique discovery signal. Subsequently, based on the control signal that was replaced with the unique discovery signal, the central management facility 1105 determines the discovery signal that is supplied to the fluorescent lamp 1110. The unique discovery signals can be generated by modulating the control signal at a frequency. The frequency can be provided to the processor by the central management facility or can be stored in the processor.

In some implementations, the central management system can have stored in memory a map of rooms and positions of lamps. For example, each room can have an ID, and each lamp in the room can have an ID. Each lamp can be driven by a corresponding processor, capable of emitting the discovery signal. Each lamp fixture can have a unique name, made out of 48 bit information. The central management system need not know a position of a lamp and a fixture to which the lamp is attached. The central management system can issue a discovery command causing the lamps to transmit their unique IDs, for example, as RF signals. As a technician walks past each lamp, the technician detects the RF emitted by the lamp, for example, using an RF receiver. The RF receiver can be linked to a computer system on which is installed a software application configured to decode the RF signal and display the lamp's unique name. The technician assigns the lamp's name to the fixture in the room. In this manner, the technician identifies each lamp in the building and maps the lamp to the corresponding fixture. In some implementations, having mapped a lamp to a fixture, the software application installed on the technician's computer system can cause the central management system to issue a command to turn off the lamp at the fixture. In response, when the lamp turns off, the technician can confirm the mapping.

Figure 12:
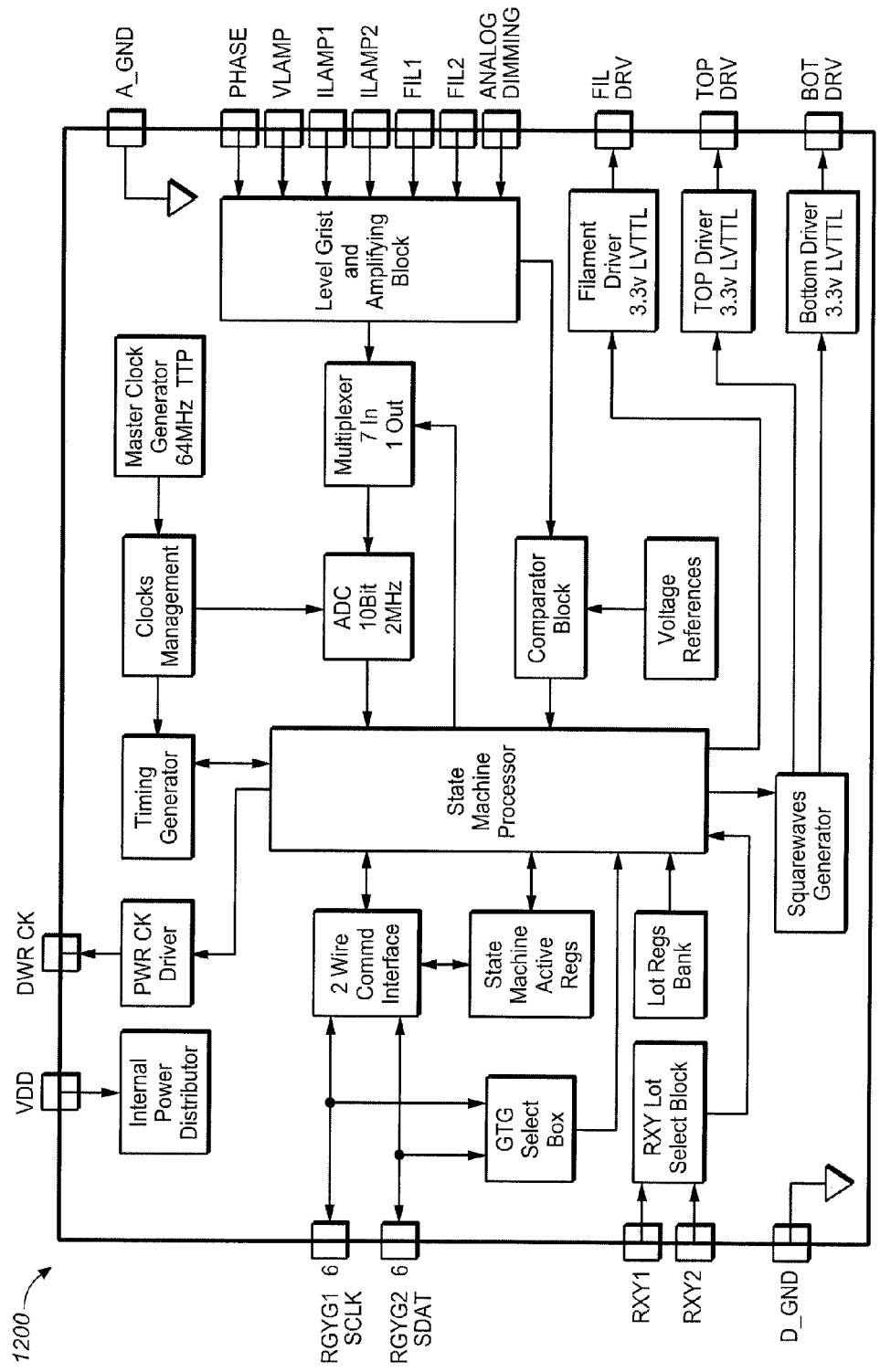
FIG. 12 is a schematic of an example processor to control an industrial lighting system.

FIG. 12 is a schematic of an example processor 1300 to control an industrial lighting system. The processor 1200 is configured to perform the operations described with reference to FIGS. 2-12. The processor 1200 can include the following components that perform the described functions:
i. Internal Power Distributor—from the incoming $V_{dd}$ builds and distributes the necessary voltage and current for the inner blocks,
ii. SYS Select Block—based on the values of two user selected resistors placed at the two adjacent pins, it selects the working mode for the device,
iii. RXY LUT Select Block—based on the values of two user selected resistors placed at the two adjacent pins, it selects the Look-Up-Table wherefrom the device reads the working parameters, as per the lamp types that it must drive,
iv. Master Clock Generator 64 MHz Typical—self generating master clock signal, used for the entire circuit,
v. Clocks Management—distributes and controls various clock signals, for various blocks of the device,
vi. Timers Generators—under the state machine control, defines and routes various timers,
vii. 2 Wire Comms Interface—communication block, used for communication between the state machine and the outside world,
viii. State Machine Active Registers—register bank, with values uploaded as per the chosen working mode,
ix. LUT Regs Bank—Look-Up-Tables registers, with specific parameters describing various lamp types,
x. State Machine Processor—hard wired state machine. Logic processor of incoming stimuli and generator of output timers and parameters,
xi. Squarewaves generator—generates the three driving square waves, as per the state machine instructions,
xii. Level Shift and Amplifiers Block—takes the 7 input stimuli and condition them as required for the internal process,
xiii. Multiplexer 7 IN 1 OUT—multiplexing block, takes the 7 input signal and time multiplex the output,
xiv. ADC 10 bit 2 MHz—analog to digital Converter, 10 bit resolution 2 MHz sampling rate. It measures the signals outputted by the Multiplexer,
xv. Comparator block—compares the conditioned signals with voltage thresholds and feed the information to the state machine,
xvi. Voltage References—delivers the references for the thresholds used by the Comparator block,
xvii. Filament Driver, 3.3 V LVTTL—output driver for the Filament control signal, 3.3V LVTTL capable,
xviii. Top Driver, 3.3 V LVTTL—output driver for the Top Driver control signal, 3.3V LVTTL capable, and
xix. Bottom Driver, 3.3 V LVTTL—output driver for the Bottom Driver control signal, 3.3V LVTTL capable.

The processor 1200 can be operatively coupled to an industrial lighting system, for example, the lighting system 1000 shown in FIG. 1. In some implementations, the processor 1200 can be operatively coupled to a computer. A technician can provide input to the processor 1200 through the computer. In response to the input, the processor 1200 can control the industrial lighting system 1000. In such implementations, the input to the processor 1200 can be provided via one or more computer program products, tangibly embodied on computer-readable media, to cause data processing apparatus to perform operations to transfer the input provided by a technician to the processor 1200. In some implementations, input to the processor 1200 can be transmitted over one or more communication networks.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims. For example, the processor can be operatively coupled to the circuits including the fluorescent lamp through one or more wireless networks, e.g., LANs. In this manner, a processor that is not coupled to a circuit by wired means can still be used to operate the fluorescent lamps.

What is claimed is:

1. A method to identify a current drawn by a fluorescent lamp in a circuit, the method comprising:
   receiving a voltage supplied to a fluorescent lamp drawing a current in response to the voltage;
   digitally sampling, by an analog-to-digital converter or processor, the voltage at a sampling frequency and associating a first time stamp with a voltage value representing one of a maximum or minimum value in observed voltage;
   receiving, by the analog-to-digital converter or processor, the current after receiving the voltage;
   digitally sampling, by the analog-to-digital converter or processor, the current at the sampling frequency and associating multiple second time stamps with a corresponding multiple current values;
   identifying a second time stamp, a difference between the first time stamp and the second time stamp being within a threshold; and
   identifying a current value associated with the second time stamp as the current drawn by the fluorescent lamp.

2. The method of claim 1, wherein the observed voltage value is a maximum voltage value.

3. The method of claim 2, further comprising:
   receiving the voltage for multiple operating cycles of the voltage;
   digitally sampling the voltage at the sampling frequency to associate multiple voltage time stamps with corresponding multiple voltage values, each maximum voltage value representing a maximum voltage belonging to each operating cycle of the voltage;
   comparing the multiple maximum voltage values to identify the maximum observed voltage value.

4. The method of claim 3, further comprising:
   receiving the current for multiple operating cycles of the current;
   digitally sampling the current at the sampling frequency to associate multiple current time stamps with corresponding multiple current values in each operating cycle of the current;
   identifying an observed current time stamp, a difference between the observed current time stamp and the maximum voltage time stamp being less than the threshold; and
   identifying a current value associated with the observed current time stamp as the current drawn by the fluorescent lamp.

5. The method of claim 1, further comprising:
   digitally sampling the voltage at the sampling frequency to associate a third time stamp to a minimum voltage value representing a minimum observed voltage corresponding to a negative portion of the voltage cycle;
   identifying a new second time stamp, a difference between the third time stamp and the new second time stamp being within the threshold; and
   identifying a current value associated with the second time stamp as the current drawn by the fluorescent lamp during the negative portion of the voltage cycle.

6. A processor configured to identify a current drawn by a fluorescent lamp in a circuit, the processor configured to perform operations comprising:
   receiving a voltage supplied to a fluorescent lamp drawing a current in response to the voltage;
   digitally sampling the voltage at a sampling frequency and associating a first time stamp with a voltage value representing one of a maximum or minimum value in observed voltage;
   receiving the current after receiving the voltage;
   digitally sampling the current at the sampling frequency and associating multiple second time stamps with a corresponding multiple current values;
   identifying a second time stamp, a difference between the first time stamp and the second time stamp being within a threshold; and identifying a current value associated with the second time stamp as the current drawn by the fluorescent lamp.

7. The processor of claim 6, wherein the observed voltage value is a maximum voltage value.

8. The processor of claim 7, the operations further comprising:
receiving the voltage for multiple operating cycles of the voltage;
digitally sampling the voltage at the sampling frequency to associate multiple voltage time stamps with corresponding multiple voltage values, each maximum voltage value representing a maximum voltage belonging to each operating cycle of the voltage;
comparing the multiple maximum voltage values to identify the maximum observed voltage value.

9. The processor of claim 8, the operations further comprising:
receiving the current for multiple operating cycles of the current;
digitally sampling the current at the sampling frequency to associate multiple current time stamps with corresponding multiple current values in each operating cycle of the current;
identifying an observed current time stamp, a difference between the observed current time stamp and the maximum voltage time stamp being less than the threshold; and
identifying a current value associated with the observed current time stamp as the current drawn by the fluorescent lamp.

10. The processor of claim 6, the operations further comprising:
digitally sampling the voltage at the sampling frequency to associate a third time stamp to a minimum voltage value representing a minimum observed voltage corresponding to a negative portion of the voltage cycle;
identifying a new second time stamp, a difference between the third time stamp and the new second time stamp being within the threshold; and
identifying a current value associated with the second time stamp as the current drawn by the fluorescent lamp during the negative portion of the voltage cycle.

11. A system to digitally compare analog signals in a circuit, the system comprising:
a fluorescent lamp;
a source to pass a voltage to the fluorescent lamp through a circuit, the fluorescent lamp drawing a current in response to the voltage;
an analog-to-digital converter operatively coupled to the circuit to receive the voltage and to receive the current; and
a processor to identify a current drawn by a fluorescent lamp, the processor configured to perform operations comprising:
receiving the voltage supplied to the fluorescent lamp;
digitally sampling the voltage at a sampling frequency and associating a first time stamp with a voltage value representing one of a maximum or minimum value in observed voltage;
receiving the current after receiving the voltage;
digitally sampling the current at the sampling frequency and associating multiple second time stamps with a corresponding multiple current values;
identifying a second time stamp, a difference between the first time stamp and the second time stamp being within a threshold; and
identifying a current value associated with the second time stamp as the current drawn by the fluorescent lamp.

12. The system of claim 11, wherein observed voltage value is a maximum voltage value.

13. The system of claim 12, the operations further comprising:
receiving the voltage for multiple operating cycles of the voltage;
digitally sampling the voltage at the sampling frequency to associate multiple voltage time stamps with corresponding multiple voltage values, each maximum voltage value representing a maximum voltage belonging to each operating cycle of the voltage;
comparing the multiple maximum voltage values to identify the maximum observed voltage value.

14. The system of claim 13, the operations further comprising:
receiving the current for multiple operating cycles of the current;
digitally sampling the current at the sampling frequency to associate multiple current time stamps with corresponding multiple current values in each operating cycle of the current;
identifying an observed current time stamp, a difference between the observed current time stamp and the maximum voltage time stamp being less than the threshold; and
identifying a current value associated with the observed current time stamp as the current drawn by the fluorescent lamp.

15. The system of claim 11, the operations further comprising:
digitally sampling the voltage at the sampling frequency to associate a third time stamp to a minimum voltage value representing a minimum observed voltage corresponding to a negative portion of the voltage cycle;
identifying a new second time stamp, a difference between the third time stamp and the new second time stamp being within the threshold; and
identifying a current value associated with the second time stamp as the current drawn by the fluorescent lamp during the negative portion of the voltage cycle.

* * * * *